United States Patent [19]

Bardl

[11] 4,446,485
[45] May 1, 1984

[54] SEMICONDUCTOR CIRCUIT WITH CLOCK-CONTROLLED CHARGE DISPLACEMENT DEVICES

[75] Inventor: Artur Bardl, Munich, Fed. Rep. of Germany

[73] Assignee: Siemens Aktiengesellschaft, Berlin and Munich, Fed. Rep. of Germany

[21] Appl. No.: 361,030

[22] Filed: Mar. 23, 1982

Related U.S. Application Data

[63] Continuation of Ser. No. 137,604, Apr. 4, 1980, abandoned.

[30] Foreign Application Priority Data

Apr. 10, 1979 [DE]  Fed. Rep. of Germany ....... 2914517

[51] Int. Cl.$^3$ .................... G06G 7/19; H01L 31/00
[52] U.S. Cl. ........................ 358/213; 250/211 N; 357/24; 382/65
[58] Field of Search ............. 250/208, 209, 211 J, 250/211 R, 578; 358/105, 204, 212, 213, 241; 357/24, 30, 32; 307/221 C, 221 D; 382/33, 34, 65, 68

[56] References Cited

U.S. PATENT DOCUMENTS

| | | | |
|---|---|---|---|
| 3,801,884 | 4/1974 | Sequin | 358/213 |
| 3,859,518 | 1/1975 | Sander | 358/105 |
| 3,940,602 | 2/1976 | Lagnado et al. | 358/213 |
| 4,010,319 | 3/1977 | Levine | 358/213 |
| 4,011,441 | 3/1977 | Michon et al. | 250/211 J |
| 4,040,092 | 8/1977 | Carnes | 250/211 J |
| 4,064,533 | 12/1977 | Lampe et al. | 358/213 |
| 4,237,383 | 12/1980 | Kosonocky et al. | 358/213 |
| 4,301,471 | 11/1981 | Holscher et al. | 358/213 |

OTHER PUBLICATIONS

Lagnado et al, "Acid Analog and Digital Correlator", *3rd Int. Conf. on Charge Coupled Devices,* University of Edinburgh, 1976, pp. 238-244.

Zimmerman et al, "A New Role for CCDs: Digital Signal Processing", *Electronics,* Mar. 31, 1977, pp. 97-103.

*Primary Examiner*—Leo H. Boudreau
*Attorney, Agent, or Firm*—Herbert L. Lerner; Laurence A. Greenberg

[57] ABSTRACT

Semiconductor circuit including at least two clock-controlled charge-displacement devices respectively having a multiplicity of storage cells with respective information content, each of the storage cells of a first one of the charge-displacement devices being operatively associated with a respective storage cell of a second one of the charge-displacement devices, means for transferring information content of the storage cells of one of the first and second charge-displacement device to the respective storage cells of the other of the first and second charge-displacement device operatively associated therewith, and means operatively associated with one of the at least two clock-controlled charge-displacement devices for serially reading-out therethrough new information obtainable as a result of the information transfer.

1 Claim, 8 Drawing Figures

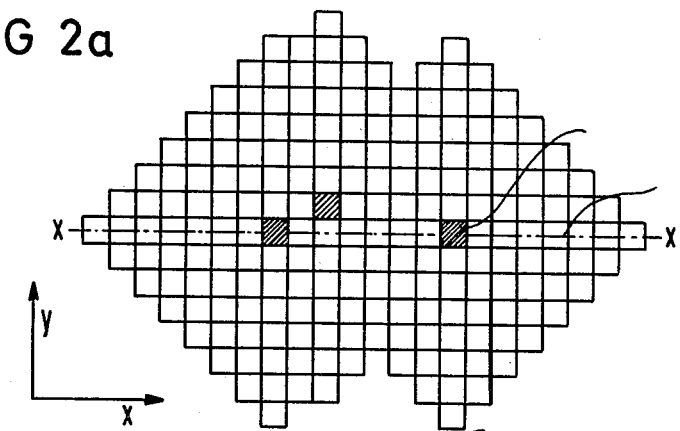
FIG 2a
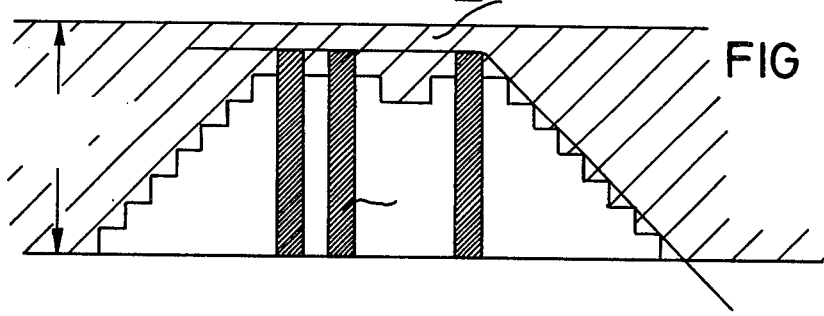
FIG 2b
FIG 2c
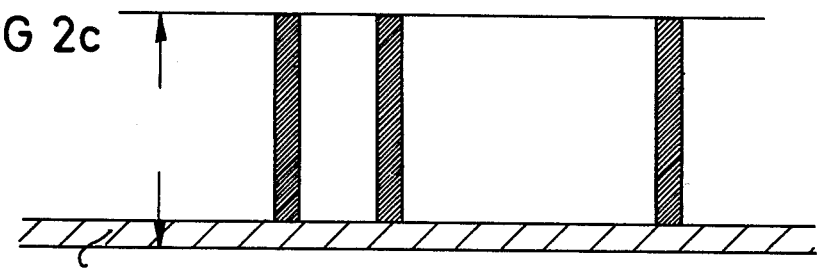
FIG 2d
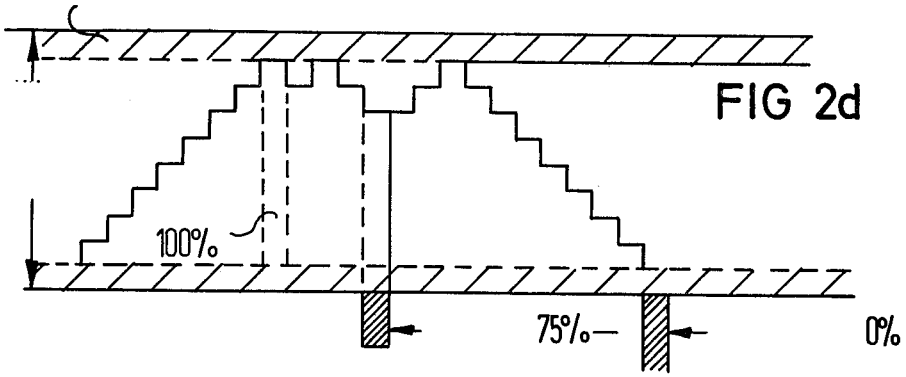

SEMICONDUCTOR CIRCUIT WITH CLOCK-CONTROLLED CHARGE DISPLACEMENT DEVICES

This is a continuation, of application Ser. No. 137,604, filed Apr. 4, 1980 now abandoned.

The invention relates to a semiconductor circuit with clock-controlled charge-displacement devices.

Charge-displacement devices of the semiconductor type are known. They are commonly called CCDs (charge-coupled devices) and are formed of a number of MOS diodes which are arranged in a silicon crystal spaced slightly behind one another and comprise the p-conduction or n-conduction silicon crystal as a common "electrode", an insulating layer covering the surface of the silicon crystal and formed especially of $SiO_2$ as a common dielectric and a respective electrode (gate) applied to the insulating layer as a second electrode. With respect to the clock supply, the electrodes of the CCD which are arranged behind one another, are connected successively to several existing clock supply lines, so that, with n clock supply lines provided, the first, the (n+1)st, the (2n+1)st and so forth electrode is connected in sequence to a first clock supply line; the second, the (n+2)nd and so forth electrode is connected to a second clock supply line, and the third, (n+3)rd and so forth electrode is connected to a third clock supply line, so that the mth, the (n+m)th, the (2n+m)th and so forth electrode is associated with the mth clock line, in accordance with the sequence of the individual capacitor electrodes. The individual clock supply lines are supplied with periodic digital pulses, the different supply lines being driven with the same frequency which is, however, phase-shifted relative to one another. A first electrode serves, in a way, as source and a last electrode as drain, and differ from the other electrodes in that they have direct contact with the silicon crystal. In analogy to an MOS field-effect transistor, they can be brought into interaction with the channel zone located under the gate electrodes by means of a source or drain zone doped oppositely to the part of the semiconductor crystal disposed below the gate electrodes.

Possible applications of such CCDs are, for example, in the field of analog signal processing, in the field of dynamic memories and in the field of opto-electronic image conversion.

It is an object of the invention to provide a semiconductor circuit of the type mentioned hereinbefore which is primarily for use in the field of opto-electronic image conversion and, among other things, also affords correlation of image patterns.

With the foregoing and other objects in view, there is provided, in accordance with the invention, a semiconductor circuit including at least two clock-controlled charge-displacement devices respectively having a multiplicity of storage cells with respective information content, each of the storage cells of a first one of the charge-displacement devices being operatively associated with a respective storage cell of a second one of the charge-displacement devices, means for transferring information content of the storage cells of one of the first and second charge-displacement device to the respective storage cells of the other of the first and second charge-displacement device operatively associated therewith, and means operatively associated with one of the at least two clock-controlled charge-displacement devices for serially reading-out therethrough new information obtainable as a result of the information transfer.

Further, in accordance with the invention, the information content of the storage cells in the first one of the charge-displacement devices is transferred in inverted state. Provision is, furthermore, especially made for the association of the storage cells of the two charge-displacement devices or CCDs to be in accordance with the geometric sequence of the storage cells in the charge-displacement devices or CCDs, which is of importance particularly in the interest of the correlations of optical patterns, the comparison of brightness or color differences and the like.

In the first charge-displacement device or CCD, there can then be produced an information distribution that is to be tested, for example, through serial feeding-in or by simultaneous, varying illumination of the semiconductor surface in the area of this CCD, which can then be evaluated by means of the device according to the invention. Similarly, a second information distribution is produced in the second CCD, which is to be compared with the information distribution in the first CCD. This is accomplished by inverting the information content of one of the respective two storage cells, which are to be compared and which belong to one of the two CCDs, by an appropriate transformation and subsequent comparison with the non-inverted content of the other storage cell.

The information resulting from the respective comparison is read out serially either through one of the two CCDs and/or through a third CCD which is equal to or even exceeds the first and the second CCD with respect to the number of storage cells thereof.

Preferably, the following situation is utilized, which relates to the correlation of patterns:

Utilizing the heretofore well-known properties of CCDs to display information three-dimensionally in a small space, it is possible to compare two patterns with one another to obtain correlation coefficients. On the basis of the coefficients it is then possible to shift the image or the pattern until coincidence is obtained. The correlation is not limited to contours or black-and-white contrasts but, rather, can also cover differently graded gray values, so that the evaluation or color differences is also possible, at least to a limited extent. The evaluation is preferably performed at constant operating speed. By connecting together light-sensitive charge generators (CIDs) and correlation CCDs on one MOS chip, it is possible to create a unit having the attributes or distinctive features of an eye. Images which are composed, for example, of 256×256 picture elements, can be passed through or compared within a range of milliseconds. The correlation accuracy is determined by suitable preparation of the optical image or pattern (changing the envelope curves) and by the comparison principle employed (individual evaluation of the picture elements, or line or block evaluation). The error rate for an individual picture element attainable with the means available at the present time is less than 6%.

Any method known heretofore can be utilized for taking the picture. For example, electromagnetic scanning, sequential scanning, line-by-line scanning, scanning with CID sensors (=optical CCD systems) and the like have been used. It is necessary in all cases that, when applied to the correlation of patterns, the sequence of the type of scanning used should agree with the readout sequence of the types of patterns from the pattern memory.

In accordance with another feature of the invention, at least one of the first and second charge-displacement devices has storage cells in the form of CID cells, the information content of which is receivable due to optical addressing thereof.

In accordance with a further feature of the invention, the information content in one of the first and second charge-displacement devices is transferable in inverted state for combination with the information content in the other of the first and second charge-displacement devices.

In accordance with an added feature of the invention, the semiconductor device includes an inverter through which, after serial read-out, the information content of the one of the first and second charge-displacement devices is delivered to the other of the first and second charge displacement devices.

In accordance with an additional feature of the invention, wherein the first and second charge-displacement devices are, respectively, located in one of two zones of opposite conduction type combined in a semiconductor crystal and having a pn-junction therebetween, and wherein the information content of one of the first and second charge-displacement devices is transferable across the pn-junction to at least one of the storage cells of the other of the first and second charge-displacement devices in the form of electric charges.

In accordance with yet another feature of the invention, the semiconductor circuit includes clock means for rhythmically controlling transfer of the electric charges.

In accordance with yet a further feature of the invention, the semiconductor circuit includes an inverter and being in combination with a memory containing pattern or standard information, one of the first and second charge-displacement devices being addressable through the inverter by the pattern or standard information contained in the memory, the other of the first and second charge-displacement devices being addressable optically.

In accordance with yet an added feature of the invention, the memory is a read-only memory.

In accordance with yet an additional feature of the invention, the semiconductor circuit includes a third charge-displacement device operatively associated in parallel with the first and second charge-displacement devices, the new combined information in the other of the first and second charge-displacement devices being transferable to the third charge-displacement device.

In accordance with another feature of the invention, the semiconductor circuit in combination with a first clock common to the at least two charge-displacement devices, and a second clock for transferring, in parallel, information from the first one of the charge-displacement devices to the second one of the charge-displacement devices, whereby the information content of the individual at least two charge-displacement devices, respectively, is serially transmitted.

In accordance with a further feature of the invention, all of the at least two charge-displacement devices extend, in the form of parallel bands, on the surface of a semiconductor crystal.

In accordance with an added feature of the invention, the semiconductor crystal is a silicon crystal.

In accordance with a concomitant feature of the invention, the semiconductor device comprises respective comparator circuits disposed between the respective associated storage cells of the first and second charge-displacement devices, each of the comparator circuits comprises two field-effect transistors and a diode mutually connected so as to afford a comparison of the information content in the respective associated storage cells.

Other features which are considered as characteristic for the invention are set forth in the appended claims.

Although the invention is illustrated and described herein as embodied in semiconductor circuit with clock-controlled charge-displacement devices, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description when read in connection with the accompanying drawings, in which:

FIG. 2a is a diagrammatic top plan view of an array of CCD bands or lines showing pattern elements;

FIG. 2b is a diagrammatic elevational view of FIG. 2a showing the so-called corona formed about the pattern spots;

FIG. 2c is a diagrammatic elevational view of a CCD band or line with the picture content thereof which is to be compared;

FIG. 2d is a diagrammatic elevational view of the CCD band or line after joining of the charges from the pattern and picture lines wherein the pattern, contrary to the picture, is inverted;

Figure 1:
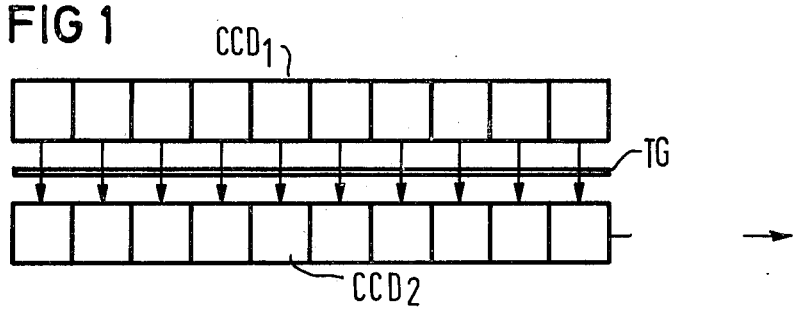
FIG. 1 is a diagrammatic plan view of a semiconductor circuit according to the invention.

Referring now to the drawing and first, particularly, to FIG. 1 thereof, there is shown therein an embodiment wherein a picture is taken or picture pickup is effected by a charge-displacement device $CCD_1$ in the form of a light-sensitive charge generator (CID), only the CID band or line being provided. In the embodiment shown in FIG. 1, a charge transfer, controlled by a transfer pulse, from the CID ($CCD_1$) to the CCD ($CCD_2$) is provided between the individual cells of the optically addressed CID ($CCD_1$) and the corresponding cells of the CCD ($CCD_2$) carrying the comparison information. The comparison information generated in the charge-displacement device $CCD_2$, for example, by serial input and present in inverted form receives, due to the information transfer from the CID ($CCD_1$), the desired comparison information in the individual cells, which is then transmitted serially, for example, through a non-illustrated multiplexer, to a non-illustrated correlator.

On the other hand, it is also possible to conceive of a number of such devices according to FIG. 1 covering the entire picture format line by line. If, after the provided exposure time, a sufficient quantity of charge carriers has been produced, the charge thereof is transferred through the transfer gate TG from the respective CID ($CCD_1$) to the corresponding CCD ($CCD_2$). There, the correlation process then occurs. A disadvantage of this method is the necessarily unequal treatment of the charges, since the charge packets generated by light pass through a parallel path for correlation, whereas the pattern is fed-in sequentially and the charge packets are subject to transport losses of different magnitude. The transport losses can be compensated for by continuously reducing the input gain during reading-in.

Three types of correlation can be performed:
(1) Continuous correlation,
(2) Correlation in either the CCD containing the picture information or the pattern information, and
(3) Correlation in a third CCD disposed between the picture and the pattern CCD.

In each of these types of correlation, the charge packets stored in the individual CCD storage cells of picture and pattern are added, the picture and the patterns being inverted relative to one another. The pattern, which can be stored as a digital image, requires a specific amount of preprocessing for correlation.

To make this clear, it is assumed, in the interest of simplicity, that all pattern elements have the same voltage amplitude P, and it is further assumed that all picture elements also have this voltage amplitude P; then agreement of picture and inverted pattern exists if addition yields the value O. In the case of the embodiment of FIG. 1, it is assumed that the voltage amplitude P equals 8 voltage units. The presentation according to FIGS. 2a to 2d is based on this example.

FIG. 2a is a top plan view of the arrangement of CCD bands or lines. The voltage amplitude of the pattern elements is not shown. To obtain a correlation value of pattern and picture, a so-called corona is formed about a picture spot or pattern spot. This corona is given in the case of the example by voltage values stepped down from the voltage amplitude P (8 voltage units in the example), the envelope curve of which determines the correlation factor. This is represented in FIG. 2b with the band or line which is indicated in FIG. 2a and is identified as X—X'.

FIG. 2c shows the band or line with the picture content that is to be compared. The picture content is made up of three picture elements with the voltage amplitude P. This band or line is disposed adjacent to the pattern band or line since, in this manner, clostly conducting connections in the overall circuit can be rendered superfluous.

FIG. 2d shows the information content after joining of the charge from the pattern line and the picture line, the pattern, contrary to the picture, being inverted. FIG. 2d shows the percentage with which the picture elements agree with the pattern elements.

With regard to the term "inversion", the following should be declared in the context of the present discussion.

In the pattern, the voltage amplitude P is defined by the charge ZERO, whereas in the picture, the voltage amplitude P is defined by the charge maximum. Applying these two definitions, no signal is produced if the pattern and the picture agree and if the content of the individual picture cells is correlated with the content of the respective pattern cell associated therewith.

As indicated hereinbefore, the pattern information is retained in a memory connection to the device according to the invention and can be called up as often as desired. It is advisable to store the pattern information including the corona around the respective pattern element in inverted condition beforehand.

If pattern and picture do not agree, an increase in the voltage beyond the signal of the pattern results due to the charge of the picture element. This voltage increase forms a measure for the non-agreement. Only this non-agreement signal is utilized for the evaluation.

In the device according to the invention diagrammatically shown in FIG. 1, and optically addressed charge-displacement device or CID identified therein by $CCD_1$ and a second charge-displacement device $CCD_2$ addressable by the inverted pattern information are provided and, between the two, a transfer gate TG is shown which triggers the charge transfer from the CID ($CCD_1$) to the CCD ($CCD_2$) upon the arrival of an auxiliary clock pulse and is realized by a gate electrode which is constructed analogously to the electrodes of the CCD device and is addressable by the auxiliary clock. The information obtained in the charge-displacement device $CCD_2$ through the transfer is serially read out and utilized.

If the difference signals between the information of the CID ($CCD_1$) and the CCD ($CCD_2$) is to be generated, then the pattern information to be utilized for the comparison must be present in the CCD ($CCD_2$) in inverted form, as has been stated hereinbefore repeatedly. The pattern information can be taken, for example, from a memory which is monolithically united with the overall circuit, especially an appropriately constructed or programmed read-only memory (ROM), wherein the pattern information is already stored in the required inverted form.

Figure 3:
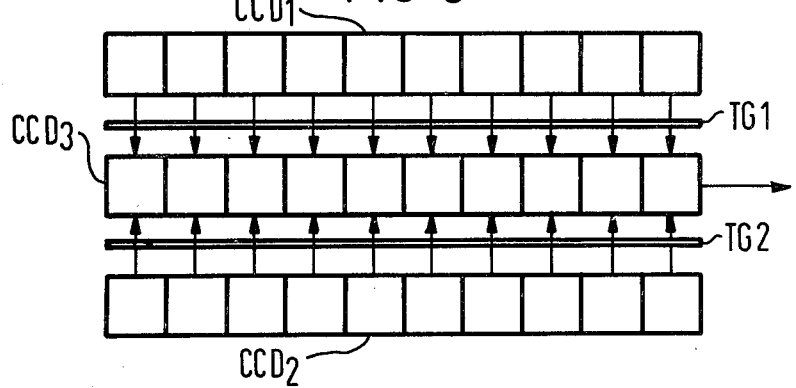
FIG. 3 is a view similar to that of FIG. 1 of another embodiment of the invention.

Otherwise, especially if the comparison device is also addressed optically, the comparison information contained therein can be read out serially and be transferred through an inverter united with the circuit into the comparison CCD ($CCD_2$) provided in the system shown in FIG. 1 or, in the case of a system according to that shown in FIG. 3, into a third change-displacement device $CCD_3$ which receives the result obtained from the comparison of the two charge-displacement devices $CCD_1$ and $CCD_2$. The signal output of the third charge-displacement device $CCD_3$ then formed the signal output of the overall system through which the information obtained from the comparison is made available.

Figure 5:
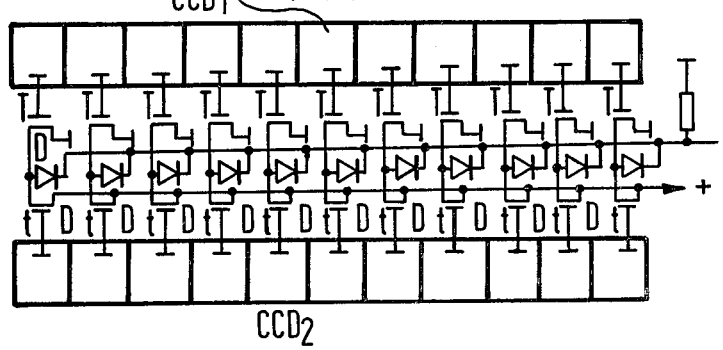
FIG. 5 is an additional view similar to that of FIG. 1 of a fourth embodiment of the invention.

It is possible to arrange between the two charge-displacement devices $CCD_1$ and $CCD_2$, a transistor arrangement such as is shown in FIG. 5. The gates of the transistors are controlled through so-called floating gates or floating diffusion terminals. Additionally required devices for setting the operating points in the floating-gate construction are not shown. The state of the charge in the CCD cell is impressed upon the transistor gates without destroying the charge deposited in the CCDs, so that the pattern and the picture can be shifted past one another without having to read both of them repeatedly. With this arrangement, a signal is always produced whenever aggrements occur. The better the agreement, the greater the signal.

The apparatus according to the invention shown in FIG. 5 and constructed in accordance with the just-explained considerations is formed of the two monolithically combined charge-displacement devices $CCD_1$ and $CCD_2$ which are controlled by the same clock sequences, except for the comparison phases per se. Between each two associated storage cells, respectively, of $CCD_1$ and $CCD_2$, a circuit is provided which is made up of two MOS field-effect transistors T and t and a diode D and makes possible the formation of the respective information difference. The transistors T and t are preferably of the enrichment type, and are generated in the monocrystalline substrate which is formed, for example, of p-conduction silicon and simultaneously contains the two charge-displacement devices $CCD_1$ and $CCD_2$. The one current-carrying lead of each of the transistors T is tied to ground and the other is connected to a respective node h which is connected, on the one hand, to the cathod of the diode D and, on the other hand, through the source-drain path of the respectively corresponding transistor t, to a second operating potential, for example, to a potential which is positive relative to ground. The anodes of the diodes D together form the signal output.

For controlling the gates of the individual transistors T and t, the latter are coupled either directly or capacitively to the semiconductor zone associated therewith and carries the CCD charge of the respective CCD cell. In the case of capacitive coupling, the capacitive coupling can be accomplished through respective floating gates associated with the CCD cell.

Figure 4:
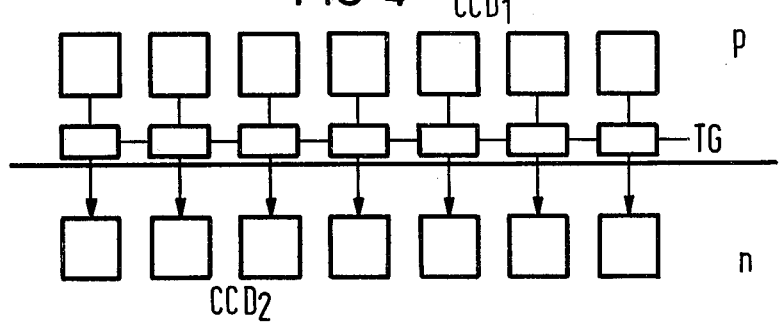
FIG. 4 is yet another view similar to that of FIG. 1 of a third embodiment of the invention.

It is possible to provide, according to FIG. 4, a pn-junction between the two charge-displacement devices $CCD_1$ and $CCD_2$, which permits, if poled in the cut-off direction, only a cut-off current carried by minority carriers. Since the charges transported in the individual charge-displacement devices $CCD_1$ and $CCD_2$ are formed of the minority carriers of the respective semiconductor zone, the possibility exists of transferring the charge from $CCD_1$ to the corresponding cells of $CCD_2$ by means of the transfer gates TG, with the clock supply being suitably constructed. Since the two charges are of the opposite type, the difference information would then appear in the $CCD_2$ in the form of an electric charge which can be evaluated through the respective CCD.

There are claimed:

1. Semiconductor circuit comprising at least two clock-controlled charge-displacement devices respectively having a multiplicity of storage cells with respective information content, each of the storage cells of a first one of said charge-displacement devices being operatively associated with a respective storage cell of a second one of said charge-displacement devices, respective comparator circuits disposed between the respective associated storage cells of said first and second charge-displacement devices, each of said comparator circuits comprising two field-effect transistors and a diode mutually connected so as to afford a comparison of the information content in the respective associated storage cells, means for transferring the information content of the storage cells of one of said first and second charge-displacement devices to the respective storage cells of the other of said first and second charge-displacement devices operatively associated therewith so as to combine the transfered information content of the storage cells of said one charge-displacement device with the information content of the respective storage cells of said other charge-displacement device, and means operatively associated with one of said at least two clock-controlled charge-displacement devices for serially reading-out therethrough information obtained as a result of the information transfer.

* * * * *